United States Patent
Wang et al.

(10) Patent No.: US 6,368,928 B1
(45) Date of Patent: Apr. 9, 2002

(54) METHOD OF FORMING AN INDIUM RETROGRADE PROFILE VIA USE OF A LOW TEMPERATURE ANNEAL PROCEDURE TO REDUCE NMOS SHORT CHANNEL EFFECTS

(75) Inventors: Howard Chih-Hao Wang, Hsin-chu; Su-Yu Lu; Mu-Chi Chiang, both of Hsinchu; Yu-Sen Chu, Kaohsiung; Chao-Jie Tsai, Hsin-Chu; Carlos H. Diaz, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/878,455

(22) Filed: Jun. 12, 2001

(51) Int. Cl.$^7$ .............................................. H01L 21/336
(52) U.S. Cl. ........................ 438/307; 438/530; 438/545
(58) Field of Search ................................. 438/305, 306, 438/307, 529, 530, 545

(56) References Cited

U.S. PATENT DOCUMENTS

| | | | |
|---|---|---|---|
| 5,650,340 A | 7/1997 | Burr et al. | 437/30 |
| 5,976,937 A | 11/1999 | Rodder et al. | 438/275 |
| 5,985,727 A | 11/1999 | Burr | 438/302 |
| 6,110,783 A | 8/2000 | Burr | 438/286 |
| 6,211,023 B1 * | 4/2001 | Yeh et al. | 438/307 |
| 6,238,985 B1 * | 5/2001 | Yoon | 438/545 |

* cited by examiner

Primary Examiner—Chandra Chaudhari
(74) Attorney, Agent, or Firm—George O. Saile; Stephen B. Ackerman

(57) ABSTRACT

A method of forming an implanted pocket region, to reduce short channel effects (SCE), for narrow channel length, NMOS devices, has been developed. After forming an initial indium pocket region, with an initial indium profile, in the area of a P type semiconductor to be used to accommodate an N type source/drain region, a low temperature anneal procedure is used to activate indium ions in the initial indium pocket region, and to create a final indium pocket region, featuring a final indium profile. The final indium profile remains unchanged after experiencing subsequent high temperature procedures, such as a post-heavily doped, source/drain anneal. The narrow channel length NMOS devices, fabricated using the low temperature anneal procedure described in this invention, resulted in a reduced Vt roll-off phenomena, when compared to counterpart, narrow channel length NMOS, formed without the benefit of the low temperature anneal procedure.

16 Claims, 3 Drawing Sheets

METHOD OF FORMING AN INDIUM RETROGRADE PROFILE VIA USE OF A LOW TEMPERATURE ANNEAL PROCEDURE TO REDUCE NMOS SHORT CHANNEL EFFECTS

BACKGROUND OF THE INVENTION (1) Field of the Invention

The present invention relates to methods used to fabricate semiconductor devices, and more specifically to a method used to form a pocket implant region, with a specific profile, for a N channel metal oxide semiconductor (NMOS), device, to alleviate short channel effects (SCE).

(2) Description of Prior Art

The use of micro-miniaturization, or the ability to fabricate semiconductor devices with sub-micron features, has resulted in improved device performance, as well as reduced process costs, for semiconductor components formed with these reduced dimensions. The use of sub-micron features allow reductions in junction capacitance to be realized, thus improving device performance, while a greater number of smaller semiconductor chips, still offering equivalent or greater device densities than counterparts fabricated with larger dimensions, can now be obtained from a specific size starting substrate, thus reducing the process cost for a specific semiconductor chip. However decreasing device features, although offering improved performance and lower process cost, can in some cases result in unwanted device phenomena, such as short channel effects (SCE), sometimes encountered with narrow channel width devices.

As the width of a gate structure shrinks, allowing performing enhancing, narrow channel lengths to be realized, the depletion region formed at the source—substrate interface, approaches the depletion region formed at the other end of the channel region established at the drain-substrate interface. The lower the dopant level of the semiconductor substrate, the greater the extent of the depletion regions. For narrow channel length devices these depletion regions can encroach, and perhaps touch, resulting in unwanted leakages or punch through. In addition the low dopant level of the semiconductor substrate, near the depletion regions, can result in a threshold voltage (Vt), roll-off phenomena, which is described as decreasing Vt values as a function of decreasing channel length. One solution to the punch through and Vt roll-off phenomena is the use of a pocket, or halo region, formed at each end of the narrow channel region, and formed with the same dopant type used in the semiconductor substrate, but at a higher dopant level, in an attempt to reduce the extent of depletion region formation. However if careful fabrication sequences are not employed the pocket region profile can broaden as a result of diffusion occurring during subsequent process steps performed at elevated temperatures, thus reducing the channel length to levels where punch through and VT roll-off phenomena again become prevalent.

This invention will describe a procedure that results in confinement, or reduced movement of the pocket implant region, during subsequent process steps performed at elevated temperatures. Specific anneal procedures applied to pocket implant regions, prior to activation and drive-in of the heavily doped source/drain regions, will result in decreased punch through leakage and Vt roll-off, when compared to counterparts fabricated without the anneal procedures taught in this invention. Prior art, such as Burr et al, in U.S. Pat. No. 5,650,783, describe a pocket implant region, however that prior art does not describe the details of the anneal procedure needed to restrict pocket implant region diffusion.

SUMMARY OF THE INVENTION

It is an object of this invention to fabricate a NMOS device, featuring a narrow channel length region.

It is another object of this invention to form an indium pocket implant region, under the lightly doped source/drain region of the NMOS device, to reduce SCE phenomena such as punch through leakage, and Vt roll-off It is still another object of this invention to perform a low temperature anneal procedure, after an indium pocket implantation procedure, and after a lightly doped source/drain implantation procedure, to reduce broadening of the indium pocket profile via unwanted anomalous diffusion of indium.

In accordance with the present invention a method of fabricating a narrow channel length region, NMOS device, featuring an indium pocket region located under a source/drain region, and subjected to a low temperature anneal procedure to restrict the broadening of the indium pocket profile, is described. After formation of a gate structure, on an underlying gate insulator layer, a first ion implantation procedure is used to form an indium pocket region in an area of a P type, semiconductor substrate, not covered by the gate structure. A second ion implantation is then performed to create an arsenic, lightly doped source/drain region, in a top portion of the indium pocket region. A low temperature anneal procedure is then employed to restrict anomalous diffusion of indium, confining the indium pocket region, followed by an RTA procedure, used to anneal implant damage so that transient enhanced diffusion (TED), will not occur in subsequent process steps such as insulator spacer deposition. Formation of insulator spacers on the sides of the gate structure, is followed by a third ion implantation procedure, used to form a heavily doped, N type source/drain region, in a region of the P type semiconductor substrate not covered by the gate structure or by the insulator spacers. A post source/drain anneal procedure is then performed.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
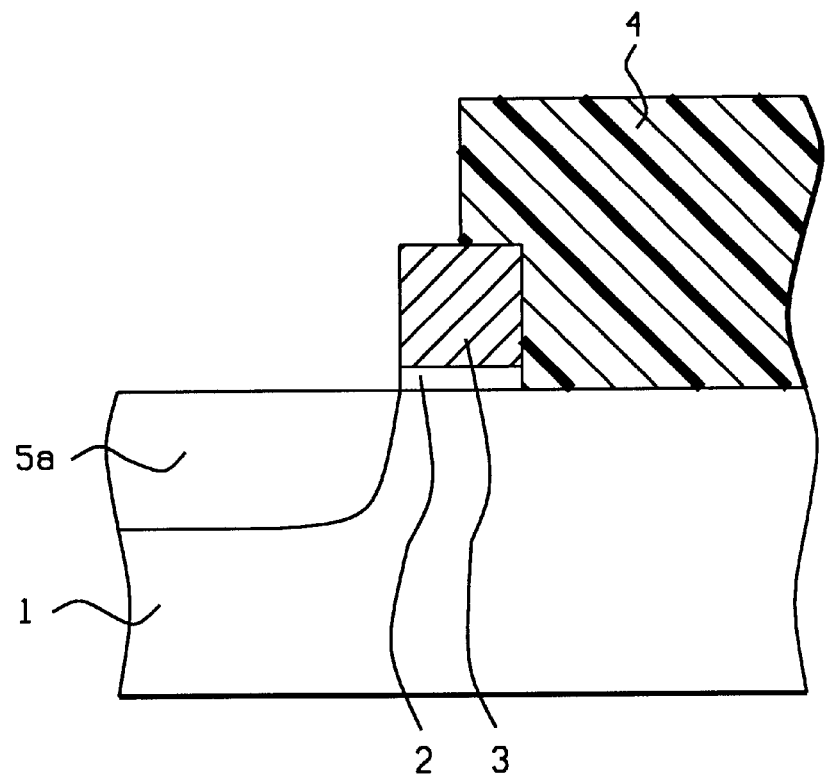
FIGS. 1–5, which schematically, in cross-sectional style, describe key stages used to fabricate a narrow channel length region, NMOS device, featuring a low temperature anneal procedure ions used to restrict the broadening of the indium pocket profile.
Figure 2:
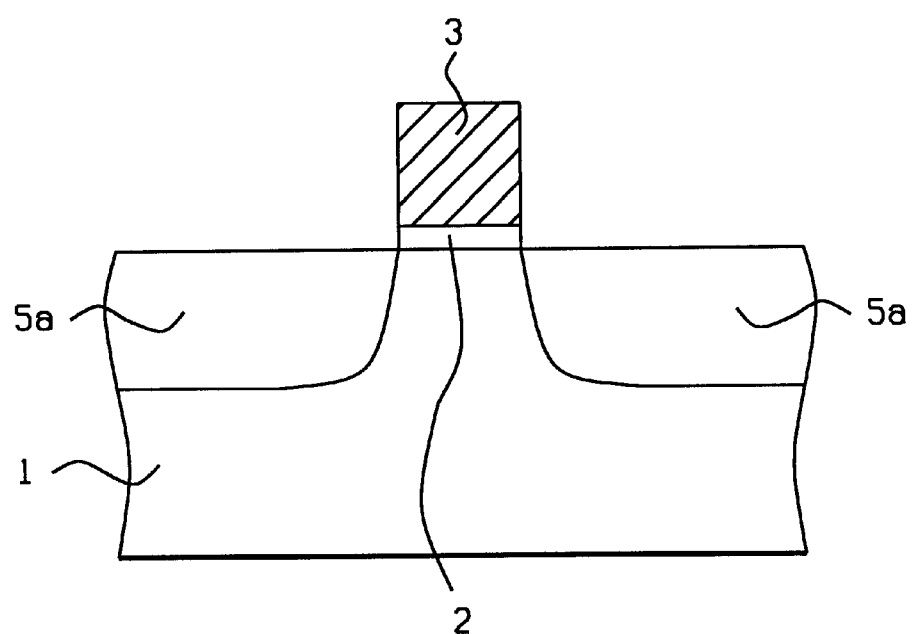

The method of forming a narrow channel length, NMOS device, featuring an indium pocket region, subjected to a low temperature anneal procedure to restrict broadening of the indium pocket region during subsequent thermal procedures, will now be described in detail. A P type semiconductor substrate 1, comprised of P type, single crystalline silicon, with a <100> crystallographic orientation, and with a resistivity between about 8 to 12 ohm-cm, is used and schematically shown in FIG. 1. Gate insulator layer 2, comprised of silicon dioxide is thermally grown, in an oxygen—steam ambient, to a thickness between about 13 to 70 Angstroms. A conductive layer, such as a doped polysilicon layer, is next deposited via low pressure chemical vapour deposition (LPCVD), procedures, at a thickness between about 1000 to 2500 Angstroms. The polysilicon layer can be in situ doped during deposition via the addition of arsine or the phosphine to a silane ambient, or the polysilicon layer can be deposited intrinsically then doped via implantation of arsenic or phosphorous ions. If desired the conductive layer can be a polycide layer, comprised of an overlying metal silicide layer such as tungsten silicide, and an underlying doped polysilicon layer. Conventional photolithographic and anisotropic reactive ion etching procedures, are next used to define gate structure 3, schematically shown in FIG. 1. Removal of the photoresist shape, used for definition of the gate structure, is accomplished via plasma oxygen ashing and careful wet cleans.

Both a symmetrical as well as an asymmetrical type device, can be rewarded via use of this invention. The symmetrical type device features the pocket region located under both a source region, at one end of the channel region, and under a drain region, located at the other end of the channel region. The asymmetrical type device is highlighted by a pocket region only located under either the source, or the drain region, of the NMOS device. For the asymmetrical device example, shown schematically in FIG. 1, photoresist shape 4, is used as a mask to protect either the source or the drain side from the implantation procedure used to form initial indium pocket region 5a. Indium is implanted at an energy between about 30 to 130 KeV, at a dose between about 5E12 to 5E14 atoms/cm$^2$. The implant dose used will result in initial indium pocket region 5a, greater in P type dopant concentration than the dopant concentration of P type semiconductor substrate 1.

The novelty of this invention will now be described for a symmetrical type device, however identical procedures now described, and schematically shown in FIGS. 2–5, can be used for the asymmetrical version. The creation of initial indium pocket regions 5a, for a symmetrical NMOS device, to be located under both a source and under a drain region, of a NMOS device, is shown schematically in FIG. 2. After removal of the photoresist shape used for definition of gate structure 3, indium ions are again implanted at an energy between about 30 to 130 KeV, at a dose between about 5E12 to 5E14 atoms/cm$^2$, in portions of semiconductor substrate 1, not covered by gate structure 3. The P type dopant concentration of initial indium pocket region 5a, is again greater than the dopant concentration of semiconductor substrate 1. The objective of the indium pocket region, with a specific dopant concentration, is to limit the extent of the depletion region formed between the source/drain—substrate regions. The higher dopant concentration of the indium pocket, compared to the dopant concentration of the P type semiconductor substrate, does limit the extent of the depletion region, however during subsequent process steps, such as the anneal cycle used to activate the dopants in a heavily doped source/drain region, the profile of the initial indium pocket region can broaden, resulting in less depletion region limiting characteristics, therefore a process used to reduce the broadening of the indium pocket region profile is needed.

Figure 3:
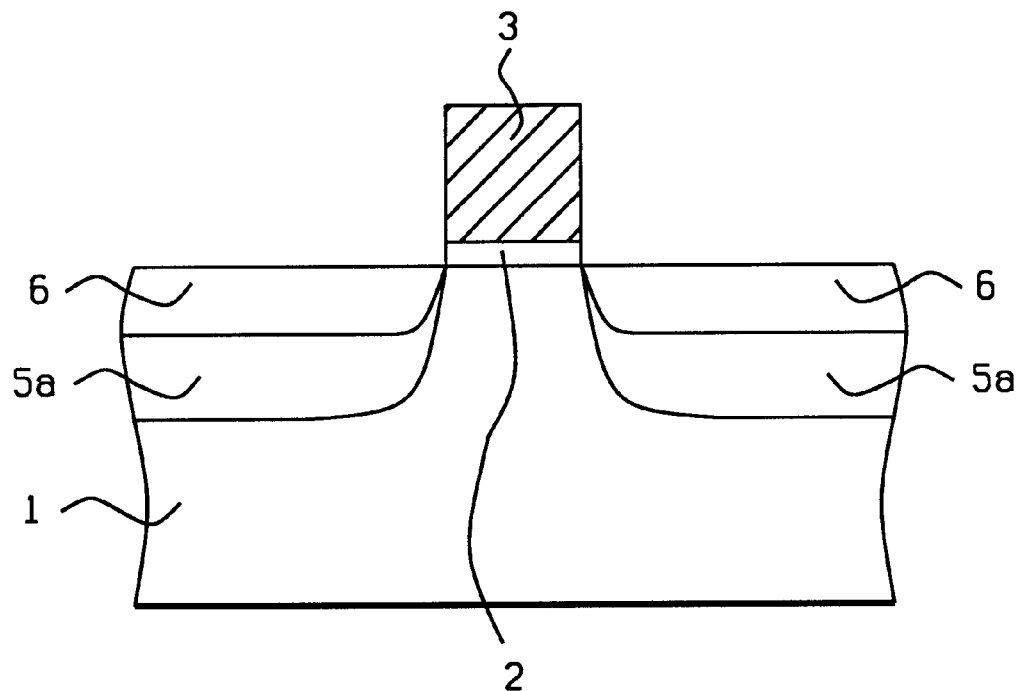
Figure 4:
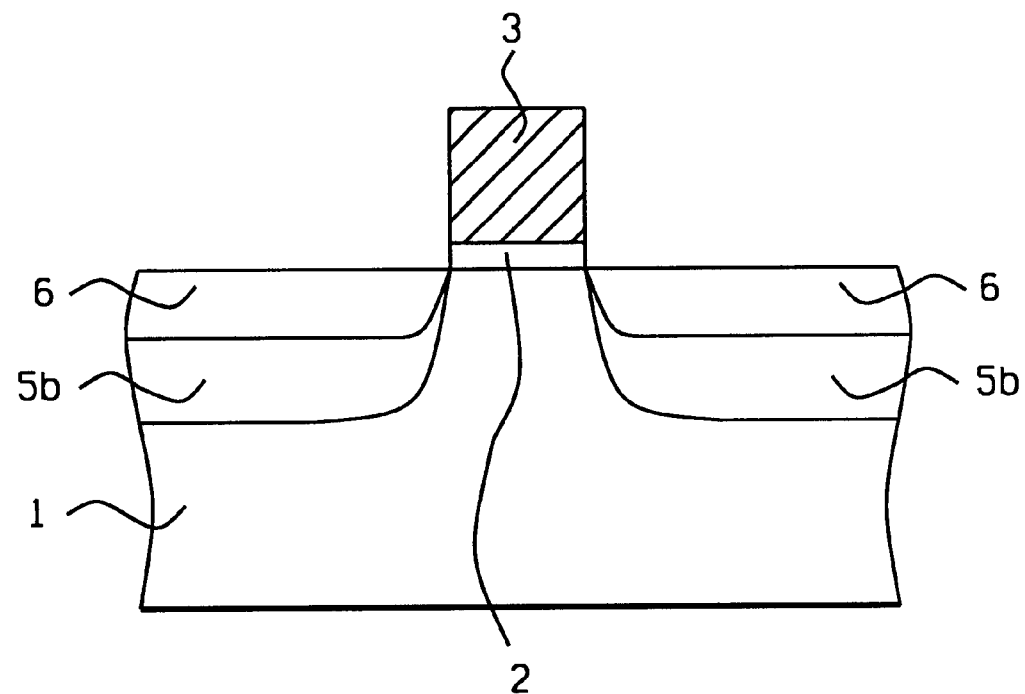

An ion implantation procedure used to create LDD, or arsenic extension regions 6, in a top portion of initial indium implant region 5a, is next addressed and schematically shown in FIG. 3. Implantation of arsenic ions, at an energy between about 1 to 10 KeV, and at a dose between about 3E14 to 2E15 atoms/cm$^2$, create LDD region 6, (in a top portion of initial indium pocket region 5a), in an area of semiconductor substrate 1, not covered by gate structure 3. At this point a critical low temperature anneal procedure is used to activate the indium ions in initial indium implant region 5a, resulting in final indium pocket implant region 5b, schematically shown in FIG. 4. The low temperature anneal procedure is performed at a temperature between about 450 to 650° C., for a time between about 1 to 180 min, in an inert ambient such as nitrogen or argon, using conventional furnace, or rapid thermal anneal (RTA), procedures. These anneal conditions will limit the diffusivity of indium, resulting in a final indium profile that will not broaden as much as counterparts, fabricated without the low temperature anneal procedure, during subsequent high temperature processing, thus supplying the desired pocket implant region needed to reduce SCE phenomena for narrow channel length, NMOS devices.

Directly following the low temperature anneal procedure, used to restrict broadening of the indium pocket region, an additional, critical anneal procedure is implemented. A rapid thermal anneal (RTA), procedure, is performed to anneal damage induced by earlier implantation procedures, thus reducing the risk of TED during subsequent thermal procedures such as the procedure used to the deposit the insulator layer for the desired insulator spacers. Therefore the TED restricting RTA procedure is performed at a temperature between about 850 to 1050° C., for a time between about 0 to 30 sec, in a nitrogen or argon ambient.

Figure 5:
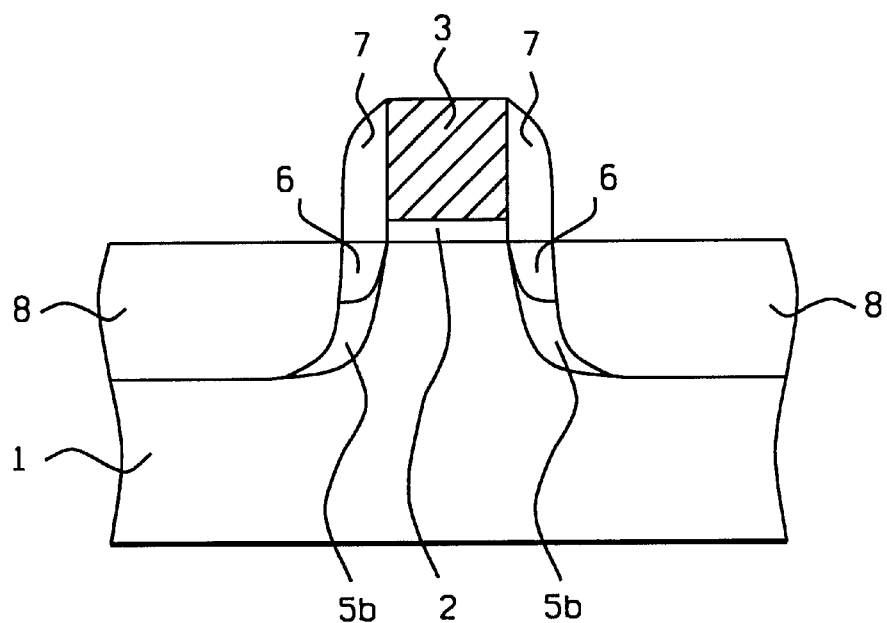

The completion of process used to fabricate the narrow channel length NMOS device, is next addressed and schematically described in FIG. 5. An insulator layer such as silicon oxide, or silicon nitride, is next deposited via LPCVD or via plasma enhanced chemical vapour deposition (PECVD), procedures, at a thickness between about 400 to 800 Angstroms, at a temperature between about 500 to 700° C. An anisotropic reactive ion etching procedure, using CHF$_3$ as an etchant for the insulator layer, is used to define insulator spacers 7, located on the sides of gate structure 3. Another ion implantation procedure is next performed, using arsenic, or phosphorous ions, at an energy between about 20 to 80 KeV, at a dose between about 1E15 to 8E15 atoms/cm$^2$, resulting in the formation of heavily doped source/drain region 8, in areas of semiconductor substrate 1, not covered by gate structure 3, or by insulator spacers 7. This is illustrated schematically in FIG. 5. A post heavily doped source/drain anneal procedure is now performed at a temperature between about 1000 to 1100° C., in an inert ambient, again using either conventional furnace or rapid thermal anneal furnace procedures. The desired profile of final indium pocket region 5b, would have been broadened during the anneal cycle, if the low temperature anneal procedure, or the combination of the low temperature anneal procedure and the TED restricting RTA procedure, had not been previously performed.

Figure 6:
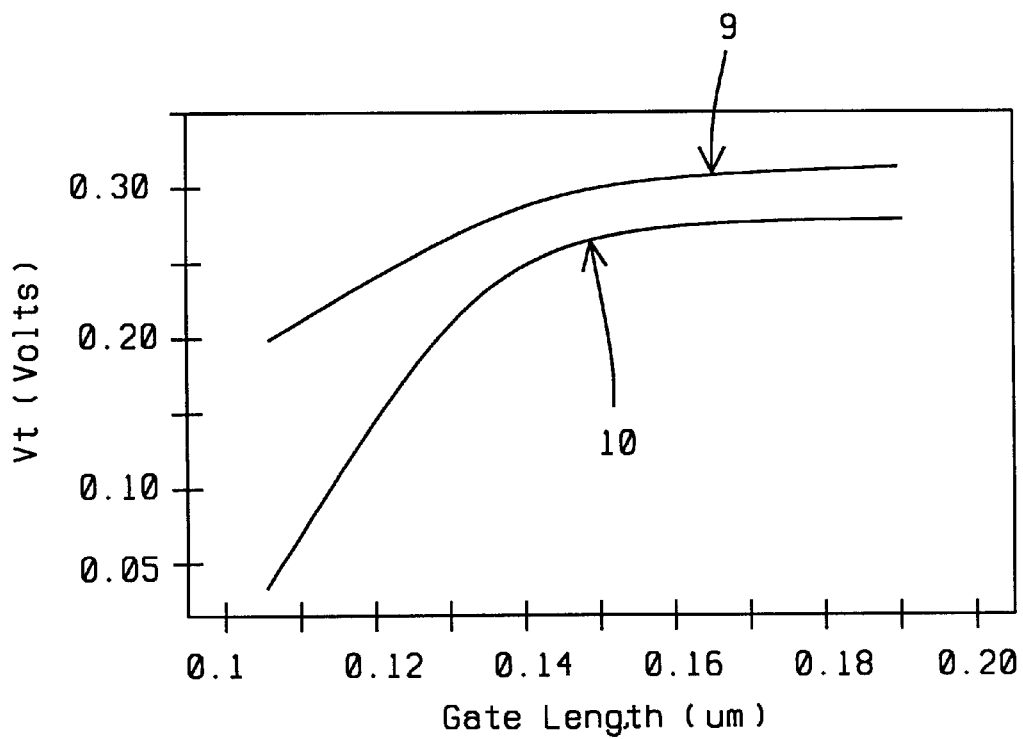
FIG. 6, which graphically illustrates the improved Vt roll-off characteristics obtained via use of indium pocket regions, featuring a post—LDD implantation, low temperature anneal procedure, when compared to counterparts fabricated without the novel low temperature anneal procedure.

Specific device characteristics, obtained for NMOS devices fabricated with and without the addition of the low temperature anneal procedures, are illustrated in FIG. 6. A threshold voltage (Vt), roll-off phenomena, for NMOS samples 10, fabricated without the use of the pocket region profile restricting, low temperature anneal procedure, is shown in FIG. 6. It can be seen that as the channel length of the NMOS device decreases, unwanted decreases in Vt are also occurring. However NMOS samples 9, featuring the low temperature anneal procedures, described in this invention, feature less Vt roll-off, for decreasing device gate lengths, when compared to counterpart NMOS samples 10. Again this is attributed to the confinement of the indium pocket profile, limiting dopant compensation at the edges of the channel region.

While this invention has been particularly shown and described with reference to, the preferred embodiments thereof, it will be understood by those skilled in the art that various changes in form and details may be made without departing from the spirit and scope of this invention.

What is claimed is:

1. A method of forming an N channel, metal oxide semiconductor (NMOS), device, on a semiconductor substrate, comprising the steps of:

providing a gate structure, overlying a gate insulator layer, on a semiconductor substrate comprised with a first conductivity type dopant;

performing a first ion implantation procedure to form an initial pocket region, of a first conductivity type, featuring an initial dopant profile, in an area of said semiconductor substrate not covered by said gate structure;

performing a second ion implantation procedure to form a lightly doped source/drain (LDD), region, of a second conductivity type, in an area of said semiconductor substrate not covered by said gate structure, with said LDD region located in a top portion of said initial pocket region;

performing a low temperature anneal procedure to activate ions in said initial pocket region, resulting in the formation of a final pocket region, with a final dopant profile;

performing a rapid thermal anneal procedure;

forming insulator spacers on sides of said gate structure; and performing a third ion implantation procedure to form a heavily doped source/drain region, of a second conductivity type, in a region of said semiconductor substrate not covered by said gate structure, and not covered by insulator spacers on sides of said gate structure.

2. The method of claim 1, wherein said gate insulator layer is a silicon dioxide layer obtained via thermal oxidation procedures at a thickness between about 13 to 70 Angstroms.

3. The method of claim 1, wherein said initial pocket region, of said first conductivity type, is comprised of indium ions, obtained via said first ion implantation procedure, wherein indium ions are implanted at an energy between about 30 to 130 KeV, at a dose between about 5E12 to 5E14 atoms/cm$^2$.

4. The method of claim 1, wherein said LDD region, of said second conductivity type, is comprised of arsenic ions, obtained via said second ion implantation procedure, performed at an energy between about 1 to 10 KeV, at a dose between about 3E14 to 2E15 atoms/cm$^2$.

5. The method of claim 1, wherein said low temperature anneal procedure, used to activate said ions in said initial pocket region, and to form said final pocket region, featuring said final dopant profile, is performed using either conventional furnace, or rapid thermal anneal procedures, at a temperature between about 450 to 650° C., for a time between about 1 to 180 min, in an argon or nitrogen ambient.

6. The method of claim 1, wherein said rapid thermal anneal procedure, is performed at a temperature between about 850 to 1050° C., for a time between about 0 to 30 sec, in an argon or nitrogen ambient.

7. The method of claim 1, wherein said insulator spacers are comprised of silicon oxide, or silicon nitride, at a thickness between about 400 to 800 Angstroms, formed via deposition of a silicon oxide or a silicon nitride layer, via LPCVD or PECVD procedures, at a temperature between about 500 to 750° C., then defined via an anisotropic reactive ion etching procedure, using CHF$_3$ as an etchant.

8. The method of claim 1, wherein said heavily doped source/drain region, of a second conductivity type, is comprised of arsenic or phosphorous ions, obtained via said third ion implantation procedure, performed at an energy between about 20 to 80 KeV, at a dose between about 1E15 to 8E15 atoms/cm$^2$.

9. A method of fabricating an NMOS device, on a P type semiconductor substrate, featuring a low temperature anneal procedure used to reduce broadening of an indium pocket region profile during subsequent high temperature procedures, comprising the steps of:

providing a gate structure on an underlying gate insulator layer, on said P type semiconductor substrate;

performing a first ion implantation procedure, using indium ions, to form an initial indium pocket region, with an initial indium profile, in an area of said P type semiconductor substrate not covered by said gate structure;

performing a second ion implantation procedure to form an N type, LDD region in an area of said P type semiconductor substrate not covered by said gate structure, with said N type, LDD region located in a top portion of said initial indium pocket region;

performing said low temperature anneal procedure to activate indium ions located in said initial indium pocket region, forming a final indium pocket region, featuring a final indium profile;

performing a rapid thermal anneal procedure to restrict subsequent transient enhanced diffusion (TED), phenomena;

forming insulator spacers on sides of said gate structure; and performing a third ion implantation procedure to form a heavily doped, N type source/drain region, in an area of said P type semiconductor substrate not covered by said gate structure or by said insulator spacers.

10. The method of claim 9, wherein said gate insulator layer is a silicon dioxide layer obtained via thermal oxidation procedures at a thickness between about 13 to 70 Angstroms.

11. The method of claim 9, wherein said initial indium pocket region is obtained via said first ion implantation procedure, wherein said indium ions are implanted at an energy between about 30 to 130 KeV, at a dose between about 5E12 to 5E14 atoms/cm$^2$.

12. The method of claim 9, wherein said N type, LDD region, is formed from arsenic ions, obtained via said second ion implantation procedure, performed at an energy between about 1 to 10 KeV, at a dose between about 3E14 to 3E15 atoms/cm$^2$.

13. The method of claim 9, wherein said low temperature anneal procedure, used to activate said indium ions in said initial indium pocket region, and to create said final indium pocket region, with said final indium profile, is performed using conventional furnace, or rapid thermal anneal procedures, at a temperature between about 450 to 650° C., in an argon or nitrogen ambient, for a time between about 1 to 180 min.

14. The method of claim 1, wherein said rapid thermal anneal procedure, is performed at a temperature between about 850 to 1050° C., for a time between about 0 to 30 sec, in an argon or nitrogen ambient.

15. The method of claim 9, wherein said insulator spacers are comprised of silicon oxide, or silicon nitride, at a thickness between about 400 to 800 Angstroms, formed via deposition of a silicon oxide or a silicon nitride layer, via LPCVD or PECVD procedures, at a temperature between about 500 to 750° C., then defined via an anisotropic reactive ion etching procedure, using $CHF_3$ as an etchant.

16. The method of claim 9, wherein said heavily doped, N type source/drain region, is formed with arsenic or phosphorous ions, obtained via said third ion implantation procedure, performed at an energy between about 20 to 80 KeV, at a dose between about 1E15 to 8E15 atoms/cm$^2$.

* * * * *